United States Patent
Gardner et al.

[19]

[11] Patent Number: 6,130,454
[45] Date of Patent: Oct. 10, 2000

[54] GATE CONDUCTOR FORMED WITHIN A TRENCH BOUNDED BY SLANTED SIDEWALLS

[75] Inventors: Mark I. Gardner, Cedar Creek; John J. Bush, Leander; Jon D. Cheek, Round Rock, all of Tex.

[73] Assignee: Advanced Micro Devices, Inc., Sunnyvale, Calif.

[21] Appl. No.: 09/111,053

[22] Filed: Jul. 7, 1998

[51] Int. Cl.[7] .................................................. H01L 29/78
[52] U.S. Cl. ........................................ 257/330; 438/270
[58] Field of Search ............................ 257/330; 438/270, 438/271, 272

[56] References Cited

U.S. PATENT DOCUMENTS

| | | |
|---|---|---|
| 3,924,265 | 12/1975 | Rodgers . |
| 3,975,221 | 8/1976 | Rodgers . |
| 4,250,519 | 2/1981 | Mogi et al. . |
| 5,448,094 | 9/1995 | Hsu ......................................... 257/330 |
| 5,453,635 | 9/1995 | Hsu et al. ............................... 257/330 |
| 5,854,501 | 12/1998 | Kao ........................................ 257/330 |

FOREIGN PATENT DOCUMENTS

| | | | |
|---|---|---|---|
| 1-189172 | 7/1989 | Japan ..................................... 257/330 |
| 2-262375 | 10/1990 | Japan ..................................... 257/330 |
| 5-021789 | 1/1993 | Japan ..................................... 257/330 |

*Primary Examiner*—David Hardy
*Attorney, Agent, or Firm*—Kevin L. Daffer; Conley, Rose & Tayon

[57] ABSTRACT

A process is provided for forming a gate conductor within a trench having opposed sidewalls which approach each other as they pass from the upper surface of a semiconductor substrate to the floor of the trench. According to an embodiment, an opening is formed through a masking layer residing upon the substrate to expose the portion of the substrate to be etched during trench formation. The opening is created using optical lithography and an etch technique. As such, the minimum width of the opening is limited in size. Once the trench has been etched in the substrate, dielectric sidewall spacers may be formed upon the sidewalls of the trench and the lateral boundaries of the masking layer. A gate conductor is subsequently formed between the sidewall spacers. The lateral width of the resulting gate conductor is thus dictated by the distance between the sidewall spacers, and hence by the thickness of the spacer material deposited upon the sidewalls of the trench. The spacers may be subsequently removed, and a relatively thick oxide layer may be formed upon the slanted trench sidewalls. The nitride layer may be removed, and dopant species may be implanted into the substrate exclusive of underneath the gate conductor. In this manner, LDD areas are formed proximate the trench sidewalls while source and drain regions are formed proximate the horizontal surface of the substrate.

14 Claims, 5 Drawing Sheets

GATE CONDUCTOR FORMED WITHIN A TRENCH BOUNDED BY SLANTED SIDEWALLS

BACKGROUND OF THE INVENTION

1. Field of the Invention

This invention relates to integrated circuit fabrication and, more particularly, to forming a trench having opposed sidewalls which approach each other as they pass from the upper surface of a semiconductor substrate to the floor of the trench. A gate conductor of a transistor may be formed upon the floor of the trench, and lightly doped drain areas may be formed at the slanted sidewalls of the trench, resulting in a recessed, densely packed transistor.

2. Description of the Relevant Art

Fabrication of a MOSFET device is well known. Generally speaking, MOSFETs are manufactured by placing an undoped polycrystalline silicon ("polysilicon") material over a relatively thin gate oxide arranged above a semiconductor substrate. The polysilicon material and the gate oxide are patterned to form a gate conductor with source and drain regions (i.e., junctions) adjacent to and on opposite sides of the gate conductor. The gate conductor and the source and drain junctions are then implanted with an impurity dopant. If the dopant species employed for forming the source and drain junctions is n-type, then an NMOSFET ("n-channel") transistor device is formed. Conversely, if the dopant species is p-type, then a PMOSFET ("p-channel") transistor device is formed. Integrated circuits utilize either n-channel devices exclusively, p-channel devices exclusively, or a combination of both on a single monolithic substrate.

In order to accommodate the high demand for faster, more complex integrated circuits, the threshold voltage of a transistor, $V_T$, must be reduced. Several factors contribute to $V_T$, one of which is the effective channel length ("Leff") of the transistor. The initial distance between the source-side junction and the drain-side junction of a transistor is often referred to as the physical channel length. However, after implantation and subsequent diffusion of the junctions, the actual distance between junctions becomes less than the physical channel length and is often referred to as the effective channel length. In ULSI designs, as the physical channel length decreases, so too must the Leff. Decreasing Leff reduces the distance between the depletion regions associated with the source and drain of a transistor. As a result, less gate charge is required to invert the channel of a transistor having a short Leff. Accordingly, reducing the physical channel length, and hence the Leff, can lead to a reduction in the threshold voltage of a transistor. Consequently, the switching speed of the logic gates of an integrated circuit employing transistors with reduced Leff is faster, allowing the integrated circuit to quickly transition between logic states (i.e., operate at high frequencies).

Unfortunately, minimizing the physical channel length of a transistor is somewhat limited by conventional techniques used to define the gate conductor of the transistor. As mentioned earlier, the gate conductor is typically formed from a polysilicon material. A technique known as lithography is used to pattern a photosensitive film (i.e., photoresist) above the polysilicon material. An optical image is transferred to the photoresist by projecting a form of radiation, primarily ultraviolet light, through the transparent portions of a mask plate. The solubility of regions of the photoresist exposed to the radiation is altered by a photochemical reaction. The photoresist is washed with a solvent that preferentially removes resist areas of higher solubility. Those exposed portions of the polysilicon material not protected by photoresist are etched away, defining the opposed sidewall surfaces of a polysilicon gate conductor.

The lateral width (i.e., the distance between opposed sidewall surfaces) of the gate conductor which dictates the physical channel length of a transistor is thus defined by the lateral width of an overlying photoresist layer. The minimum lateral dimension that can be achieved for a patterned photoresist layer is unfortunately limited by, inter alia, the resolution of the optical system (i.e., aligner or printer) used to project the image onto the photoresist. The term "resolution" describes the ability of an optical system to distinguish closely spaced objects. Diffraction effects may undesirably occur as the radiation passes through slit-like transparent regions of the mask plate, affecting the resolution of the optical system. As such, the features patterned upon a masking plate may be incorrectly printed onto the photoresist.

Although shrinking device dimensions advantageously affords increased circuit density and speed, it can also give rise to various problems. Decreasing the Leff of a transistor, for example, generally leads to so-called short-channel effects ("SCE") in which the transistor subthreshold current is increased and the drive current is decreased. Absent a comparable reduction in the depth of the source and drain junctions, the severity of SCE may be profound. The formation of shallow source and drain junctions is, however, rather difficult to accomplish in transistor devices which employ fast-diffusing species as the dopant. Due to their relatively high diffusivity, some dopant species, such as boron, can penetrate deeply into the substrate. Also, advances in technology are required to make available low-energy ion implanters before low implant depths can be realized.

While reducing the junction depth provides protection against SCE, it also undesirably gives rise to increased resistance in the source and drain junctions. As the resistance in the source and drain junctions increases, the saturation drive current and the overall speed of the transistor may drop. Moreover, forming ohmic contacts to relatively shallow junctions has several drawbacks. A contact layer which consumes the underlying source and drain junctions is often used during contact formation. For example, a refractory metal may be deposited across the source and drain junctions and heated to promote a reaction between the metal and the silicon of the underlying substrate. As a result of the reaction, a low resistivity self-aligned silicide (i.e., salicide) may form upon the junctions. The silicide may completely consume relatively shallow junctions, penetrating into the substrate underneath the junctions, a phenomenon known as "junction spiking". Consequently, the junctions may exhibit large current leakage or become electrically shorted. Therefore, precautions must be taken to prevent excessive consumption, and hence junction spiking, of the shallow junctions during contact formation.

It would therefore be desirable to develop a transistor fabrication technique in which the Leff of the transistor is reduced to provide for high frequency operation of an integrated circuit. More specifically, a process is needed in which the channel length is no longer dictated by the resolution of a lithography optical aligner. Furthermore, it would be beneficial for the transistor to be substantially resistant to short channel effects, despite undergoing a reduction in Leff. That is, the transistor design should call for relatively shallow "effective" source and drain regions which have low resistances. While reducing the effective depth of the source and drain regions would be desirable, the actual depth of the source and drain regions must be sufficiently large to avoid problems associated with junction spiking and excessive junction consumption.

SUMMARY OF THE INVENTION

The problems outlined above are in large part solved by the technique hereof for forming a gate conductor within a trench having opposed sidewalls which approach each other as they pass from the upper surface of a semiconductor substrate to the floor of the trench. According to an embodiment, an opening is formed through a masking layer residing upon the substrate to expose the portion of the substrate to be etched during trench formation. The opening is created using optical lithography and an etch technique. As such, the minimum width of the opening is limited in size. Once the trench has been etched in the substrate, dielectric sidewall spacers may be formed upon the sidewalls of the trench and the lateral boundaries of the masking layer. A gate conductor is subsequently deposited into the trench between the sidewall spacers to a level spaced above the masking layer. The portion of the gate conductor not residing between the sidewall spacers may then be removed. The lateral width of the resulting gate conductor is thus dictated by the distance between the sidewall spacers, and hence by the thickness of the spacer material deposited upon the sidewalls of the trench. As such, the distance between the sidewall spacers may be reduced by increasing the amount of spacer material deposited into the trench. Therefore, the distance between sidewall spacers, and hence the lateral width of the gate conductor, may be advantageously reduced well-below the minimum definable dimension of lithography.

In one embodiment, the masking layer comprises a silicon nitride ("nitride") layer arranged across a silicon dioxide ("oxide") layer. After etching an opening through the masking layer, a select portion of the silicon-based substrate not covered by the masking layer is etched to form the trench. The sidewalls of the trench are purposefully formed such that they are non-perpendicular to the horizontal surface of the substrate (hereinafter "slanted"). A plasma etch technique in which carbon becomes deposited upon the substrate surface as it is being etched may be used to form the slanted sidewalls of the trench. The plasma used for the etch is preferably provided with $O_2$ and a fluorocarbon selected from the group consisting of $C_2F_6$, $CH_4$, $CHF_3$, and $C_3F_8$. The anisotropic nature of the plasma etch results in more frequent ion bombardment of horizontally oriented surfaces than vertically oriented surfaces. The addition of $O_2$ to the plasma increases the etch rate of the Si substrate by allowing C radicals to react with O-containing radicals to form volatile compounds, e.g., CO and $CO_2$, and thus freeing up F radicals to react with the Si.

The amount of $O_2$ added to the plasma is, however, kept at a minimal to ensure that a substantial portion of the C radicals created in the plasma remain free to adsorb onto the substrate, where they may form a nonvolatile film. The nonvolatile film serves as a "passivant" in that it protects the topological surface upon which it resides from exposure to species, such as ions. Ion bombardment of the passivant residing upon horizontally oriented surfaces removes the passivant to permit excited F atoms to be adsorbed upon the underlying silicon surface. Absent significant ion ablation of vertically oriented surfaces, the C passivant remains laterally adjacent the lateral boundaries of the masking layer, above the edges of the exposed portion of the substrate. As such, the F atoms are only allowed to absorb upon the mid-region of the substrate interposed between those edges covered by the C passivant. As the absorbed F atoms are bombarded by ions, they react with Si atoms to form volatile species, e.g., $SiF_4$, so that the mid-region of the substrate is etched. As the mid-region is etched, vertical sidewall surfaces are formed in the substrate upon which the C passivant can accumulate. Therefore, as the etch progresses, the amount of substrate remaining uncovered by the C passivant decreases, and the sidewalls of the resulting trench become slanted. Alternatively, the slanted sidewalls of the trench may be formed using an etch technique which selectively etches the crystal plane of the silicon-based substrate, e.g., the (100) plane.

Subsequent to forming the trench within the substrate, an oxide may be thermally grown upon the sidewalls and floor of the trench. The nitride layer residing upon the horizontal upper surface of the silicon-based substrate serves as a barrier to oxygen, and thus prevents the growth of oxide upon the upper surface. Thereafter, the dielectric sidewall spacers are formed extending laterally from the opposed sidewalls of the trench and the lateral boundaries of the masking layer. The gate conductor comprising, e.g., polysilicon, is then formed between the pair of sidewall spacers. The dielectric sidewall spacers may then be removed using, e.g., an anisotropic etch technique which is highly selective to the spacer material. The oxide arranged upon the opposed sidewalls of the trench may also be removed during the etch step. A lightly doped drain ("LDD") implant is then self-aligned to the lateral boundaries of the masking layer and the opposed sidewall surfaces of the gate conductor. In this manner, LDD areas are formed within the substrate proximate the opposed sidewalls of the trench. The LDD areas thus extend diagonally between the horizontal surface of the substrate and the floor of the trench. Advantageously, LDD areas configured in this manner require less lateral space than LDD areas of the same size in a conventional LDD design. As such, the packing density of the integrated circuit employing the LDD areas is increased.

An oxide layer may then be thermally grown upon the exposed surfaces of the polysilicon gate conductor and the opposed sidewalls of the trench. The orientation of the crystal planes at the surfaces of the slanted trench sidewalls causes the oxide to grow at a faster rate upon the trench sidewalls than upon the gate conductor sidewalls. The oxide layer serves to inhibit the gate conductor and the substrate from being etched as the nitride layer is subsequently removed from the underlying pad oxide layer. The nitride layer is removed using an etch technique which is highly selective to nitride relative to oxide. A source/drain ("S/D") implant is then forwarded into source and drain regions of the substrate exterior to the trench. The relatively thick layer of oxide upon the trench sidewalls helps ensure that very few dopant species are implanted into the LDD areas during the S/D implant. In an alternate embodiment, the LDD areas and the source and drain regions may be doped using a single implant step. No separate LDD implant is performed. The thick oxide layer formed upon the trench sidewalls may serve to prevent some of the dopants passing therethrough from reaching the substrate. In this manner, a lower concentration of dopant becomes incorporated into the LDD areas proximate the trench sidewalls than in the source and drain regions.

Placing the gate conductor partially within a trench such that its base is recessed below the upper surface of the substrate allows the source and drain regions to be formed to a relatively shallow "effective" depth. The channel region of the resulting transistor is thus spaced below the source and drain regions. Only a portion of the actual depth of the source and drain regions thus may be used as the terminals of the output voltage during operation of the resulting transistor. The overall depth of the source and drain regions is, however, sufficiently large to provide for low resistance in the source and drain regions, and thus affords high saturation drive current of the transistor. Further, junction spiking through the entire depth of the source and drain regions is unlikely to occur during the formation of silicide upon the source and drain regions.

BRIEF DESCRIPTION OF THE DRAWINGS

Other objects and advantages of the invention will become apparent upon reading the following detailed description and upon reference to the accompanying drawings in which:

FIG. 4 is a partial cross-sectional view of the semiconductor topography, wherein an oxide is thermally grown upon the trench sidewalls and floor, subsequent to the step in FIG. 3a;

FIG. 10a is a partial cross-sectional view of the semiconductor topography, wherein an oxide layer is thermally grown across the surfaces of the gate conductor and the sidewalls of the trench, subsequent to the step in FIG. 9a;

FIG. 11 is a partial cross-sectional view of the semiconductor topography, wherein a source/drain implant is forwarded into the substrate to form source and drain regions laterally adjacent the LDD areas, subsequent to the step in FIG. 10a.

DETAILED DESCRIPTION OF THE INVENTION

Figure 1:
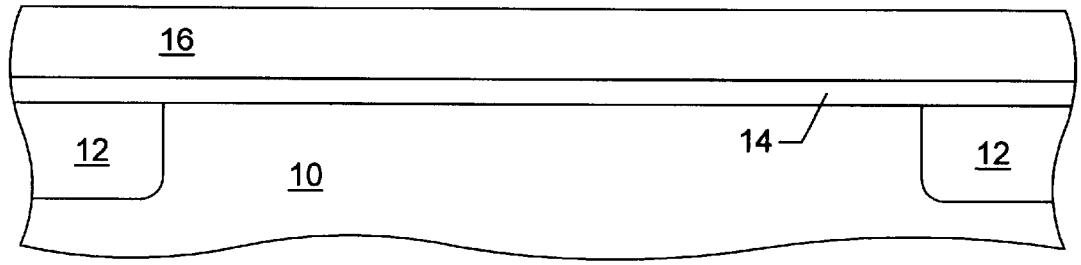
FIG. 1 is a partial cross-sectional view of a semiconductor topography, wherein a pad oxide layer and a nitride layer are formed across a semiconductor substrate.

Turning now to FIG. 1, a partial cross-sectional view of a semiconductor substrate 10 is depicted. Substrate 10 preferably comprises single crystalline silicon which has been slightly doped with n-type or p-type impurities. Dielectric isolation regions, such as shallow trench isolation structures 12, are arranged spaced distances apart within substrate 10 for dielectrically isolating ensuing active areas. Alternatively, the dielectric isolation regions may be replaced with well-known LOCOS structures. In an alternate embodiment, p-type and n-type wells may be arranged within select regions of substrate 10 to allow for the formation of a CMOS integrated circuit which includes both NMOSFET and PMOSFET transistors. A pad oxide layer 14 is formed across semiconductor substrate 10 using, e.g., chemical-vapor deposition ("CVD") of oxide from a silane- and oxygen-bearing gas. A nitride layer 16 may then be CVD deposited across pad oxide layer 14 from, e.g., a silane- and ammonia-bearing gas. Pad oxide layer 14 serves to reduce the inherent stresses which normally exist between nitride and silicon. Nitride layer 16 in combination with pad oxide layer 14 may serve as a masking layer during subsequent processing steps.

Figure 2:
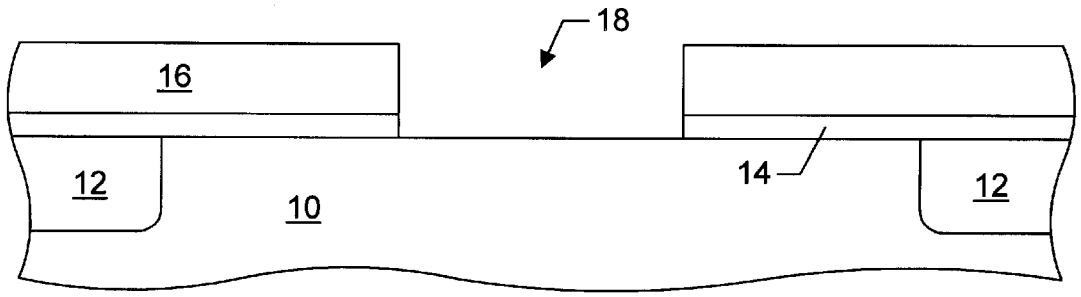
FIG. 2 is a partial cross-sectional view of the semiconductor topography, wherein an opening is etched through the nitride layer and the pad oxide layer to the substrate, subsequent to the step in FIG. 1.
Figure 3A:
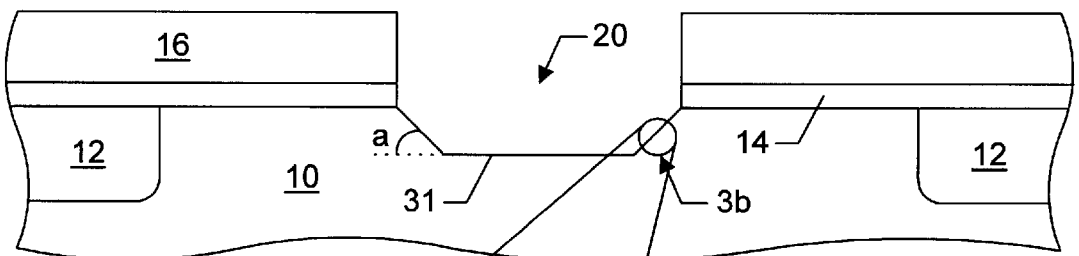
FIG. 3a is a partial cross-sectional view of the semiconductor topography, wherein the substrate is etched to define a trench having slanted sidewalls within the substrate, subsequent to the step in FIG. 2.

Turning to FIG. 2, portions of nitride layer 16 and pad oxide layer 14 are removed to form an opening 18 between a pair of lateral boundaries of nitride layer 16. Prior to forming opening 18, a layer of photoresist may be patterned above nitride layer 16 using optical lithography. The photoresist serves to protect underlying regions of nitride layer 16 from being etched. The region of nitride layer 16 remaining uncovered by the photoresist is etched using, e.g., a dry, plasma etch in which the etch duration is selected to terminate before substantial portions of substrate 10 may be removed. The lateral width of opening 18 may be, e.g., 0.2 micron (i.e., the minimum definable dimension of lithography). FIG. 3a illustrates the formation of a trench 20 within substrate 10. Trench 20 may be formed by anisotropically etching substrate 10 using a plasma provided with $O_2$ and a fluorocarbon, e.g., $C_2F_6$, $CH_4$, $CHF_3$, and $C_3F_8$. A carbon passivant is deposited upon the exposed portion of substrate 10 during the anisotropic etch. However, since the passivant is continuously removed from horizontally oriented surfaces, it is allowed to build up only on vertically oriented surfaces. As a result of the anisotropic etch, the opposed sidewalls of trench 20 are formed at an angle a relative to the floor 31 of the trench. The trench sidewalls approach each other as they pass from the horizontal surface of substrate 10 to the trench floor. The angle a may range from approximately 25° to 55°. The trench floor may be spaced below the upper surface of substrate 10 by, e.g., 0.1 to 0.5 micron.

Figure 3B:
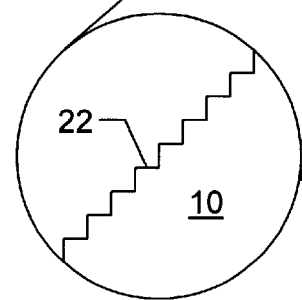
FIG. 3b is a detailed view along section 3b of FIG. 3a, wherein the slanted sidewalls of the trench comprise a plurality of stair steps as a result of a carbon passivant forming upon the substrate while the trench is being etched.

FIG. 3b illustrates a detailed view along section 3b of FIG. 3a. The trench sidewall 22 is shaped somewhat like a stair case. The carbon passivant is allowed to accumulate upon the vertical sidewalls of each stair as the etch progresses. It may be stripped from substrate 10 subsequent to the formation of trench 20. Alternatively, an etch technique which is highly selective to the crystal plane of substrate 10 may be used to form the slanted trench sidewalls. The crystal plane of substrate 10 may, e.g., have a (100) orientation.

Figure 4:
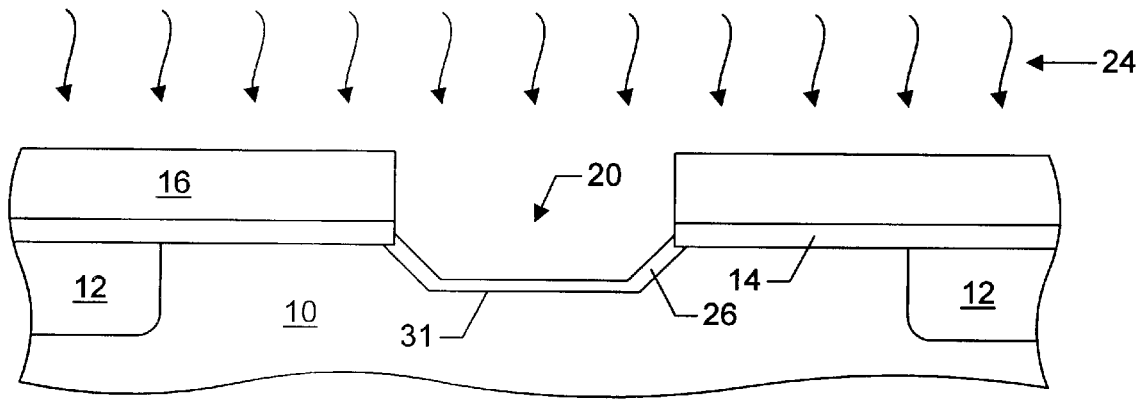
Figure 5:
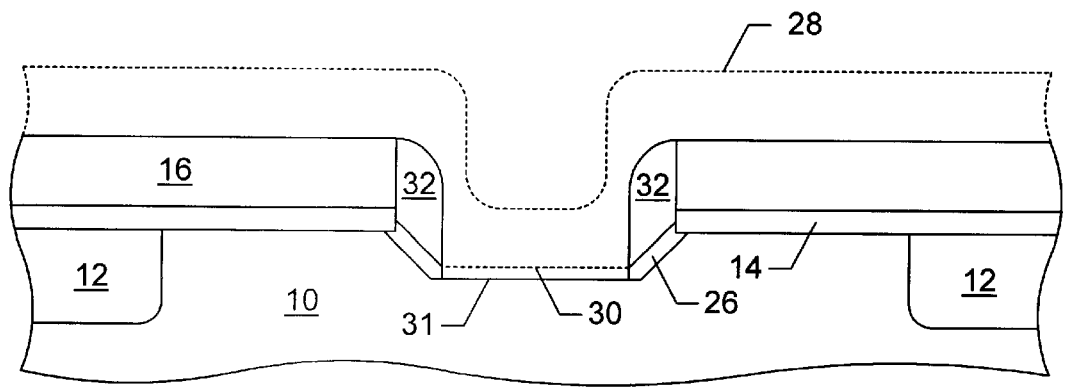
FIG. 5 is a partial cross-sectional view of the semiconductor topography, wherein dielectric sidewall spacers are formed extending laterally from the lateral boundaries of the masking layer and the trench sidewalls, subsequent to the step in FIG. 4.

FIG. 4 illustrates the formation of an oxide 26 upon the sidewalls and floor 31 of trench 20. Oxide 26 may be formed by, e.g., exposing the silicon-based substrate 10 to thermal radiation 24 while placing substrate 10 in an oxygen-bearing ambient. Radiation 24 may be supplied from an annealing furnace or a rapid thermal anneal ("RTA") chamber. Nitride layer 16 substantially inhibits ambient oxygen from penetrating to and oxidizing underlying regions of substrate 10. The O atoms in oxide 26 terminates the dangling bonds at the edges of substrate 10 that resulted from etching the substrate, and thus reduces the number of entrapments for foreign species at those edges. As shown in FIG. 5, dielectric sidewall spacers 32 are then formed adjacent the opposed lateral boundaries of nitride layer 16 and the opposed sidewalls of trench 20. Sidewall spacers 32 may be formed by first depositing a dielectric, e.g., oxide, across the semiconductor topography. The dielectric is then anisotropically etched until it only remains upon the opposed sidewalls of trench 20 and the lateral boundaries of nitride layer 16. A portion of the oxide 26 residing upon the floor of trench 20 may also be removed during the anisotropic etch. Dotted line 28 represents the surface of the spacer dielectric prior to being etched. Also, dotted line 30 represents the surface of the oxide 26 prior to being etched.

Figure 6:
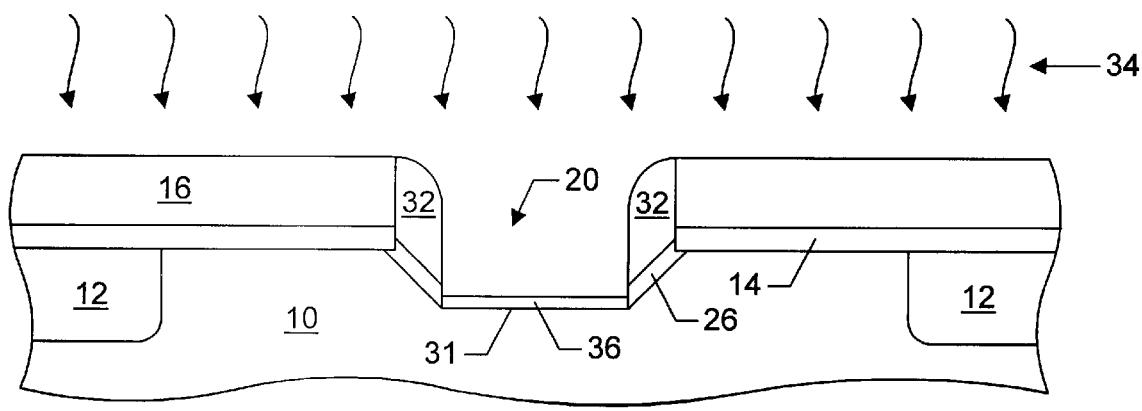
FIG. 6 is a partial cross-sectional view of the semiconductor topography, wherein a gate oxide is formed upon the floor of the trench, subsequent to the step in FIG. 5.
Figure 7:
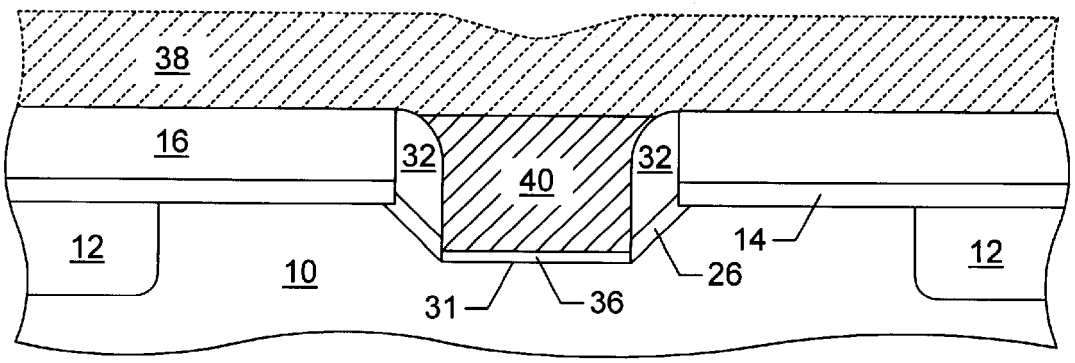
FIG. 7 is a partial cross-sectional view of the semiconductor topography, wherein a gate conductor is formed between the pair of dielectric sidewall spacers such that a base of the gate conductor is recessed below the horizontal surface of the substrate, subsequent to the step in FIG. 6.
Figure 8:
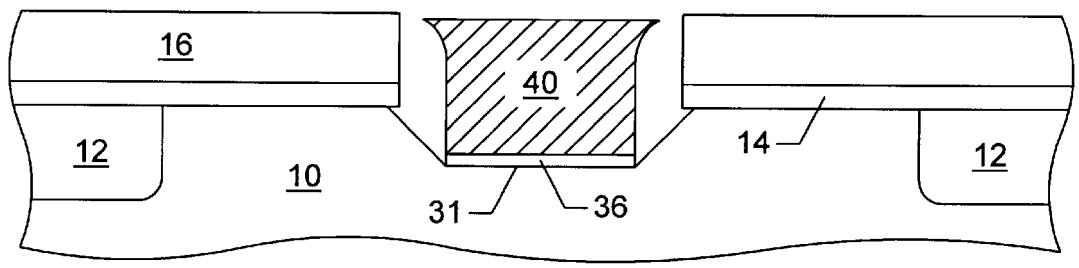
FIG. 8 is a partial cross-sectional view of the semiconductor topography, wherein the dielectric sidewall spacers and the oxide layer are removed from the slanted sidewalls of the trench, subsequent to the step in FIG. 7.

Turning to FIG. 6, a gate dielectric 36 is then formed upon the floor of trench 20. Gate dielectric 36 may, e.g., be thermally grown upon the trench floor by exposing substrate 10 to thermal radiation 34 and an oxygen-bearing ambient. As shown in FIG. 7, a gate conductor 40 may then be formed between dielectric sidewall spacers 32. Gate conductor 40 may be formed by depositing a conductive or semiconductive material, e.g., polysilicon, across the semiconductor topography to a level spaced above nitride layer 16. Polysilicon may be CVD deposited from, e.g., a silane source. A portion 38 of the gate conductor material may then be removed using, e.g., chemical-mechanical polishing ("CMP") or sacrificial etchback. In this manner, the upper surface of gate conductor 40 is made substantially coplanar with the upper surface of nitride layer 16. If gate conductor 40 comprises polysilicon, it may be rendered conductive by the subsequent implant of dopants therein. FIG. 8 depicts the removal of dielectric sidewall spacers 32 and oxide 26 from the opposed sidewalls of the trench. An etch technique, e.g., a dry, plasma etch, which exhibits a high selectivity for oxide relative to nitride may be used to remove spacers 32 and oxide 26.

Figure 9A:
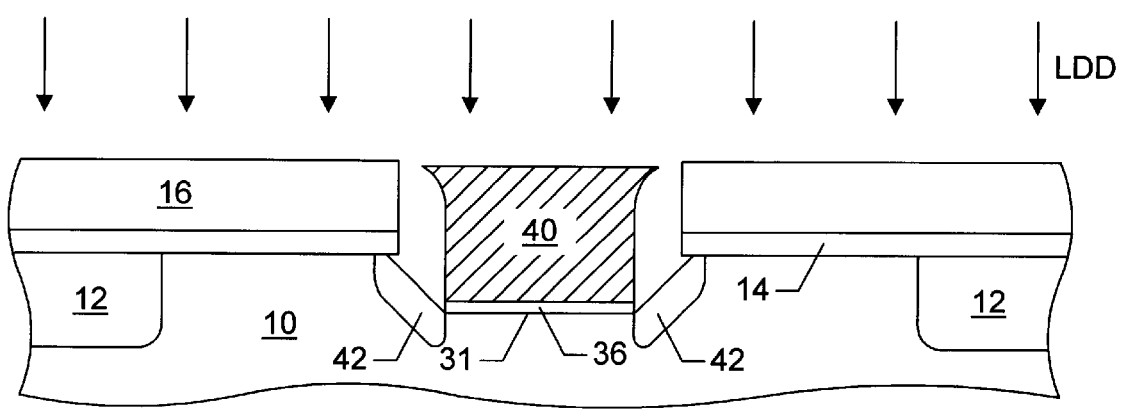
FIG. 9a is a partial cross-sectional view of the semiconductor topography according to one embodiment, wherein an LDD implant is self-aligned to the lateral boundaries of the masking layer and the opposed sidewall surfaces of the gate conductor to form LDD areas proximate the opposed sidewalls of the trench, subsequent to the step in FIG. 8.
Figure 9B:
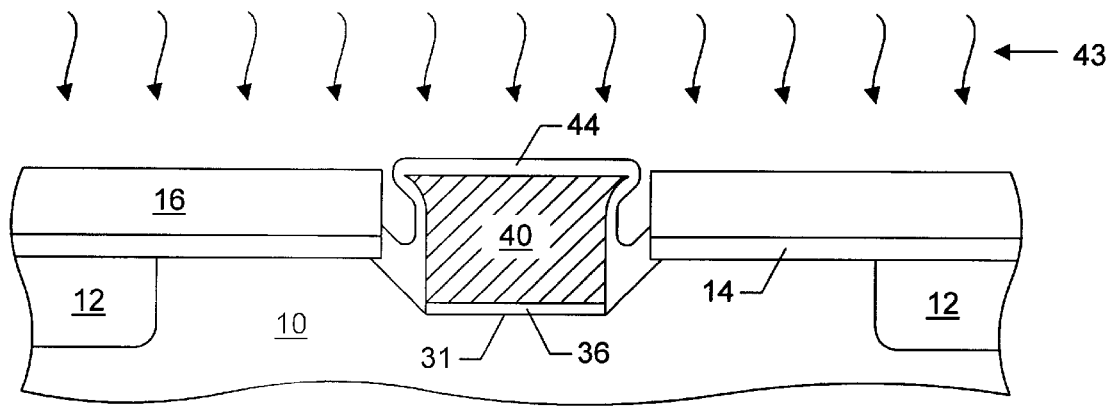
FIG. 9b is a partial cross-sectional view of the semiconductor topography according to another embodiment, wherein an oxide layer is thermally grown across the surfaces of the gate conductor and the sidewalls of the trench, subsequent to the step in FIG. 8.

FIG. 9a illustrates a processing step subsequent to that shown in FIG. 8, according to one embodiment. An LDD implant of dopant species is self-aligned to the lateral boundaries of nitride layer 16 and the opposed sidewall surfaces of gate conductor 40. As a result of the LDD implant, LDD areas 42 which contain a light concentration of dopant are formed proximate the slanted surfaces of the trench. FIG. 9b depicts a processing step which may be performed subsequent to the step in FIG. 8, according to an alternate embodiment. The topography is exposed to thermal radiation 43 while in an oxygen-bearing ambient. In this manner, an oxide layer 44 is formed upon the opposed sidewalls of the trench and the surfaces of gate conductor 40. The orientation of the crystal lattice planes at the slanted sidewalls of the trench affords enhanced oxide growth upon those sidewalls. In particular, the portion of oxide layer 44 arranged upon the trench sidewalls may be about 3 times thicker than the other portion of oxide layer 44 arranged adjacent the sidewalls of gate conductor 40.

Figure 10A:
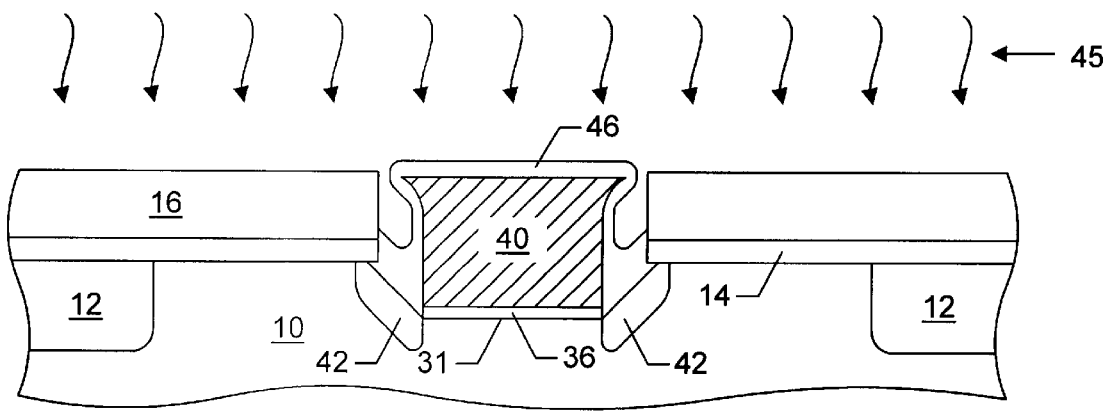
Figure 10B:
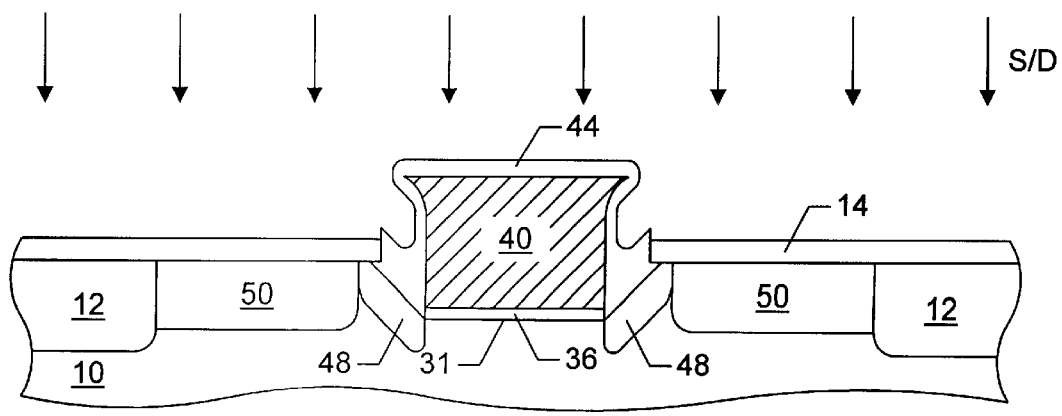
FIG. 10b is a partial cross-sectional view of the semiconductor topography, wherein a source/drain implant is forwarded into the substrate to form source and drain regions laterally adjacent the LDD areas, subsequent to the step in FIG. 9b.

FIG. 10a depicts a processing step subsequent to the step shown in FIG. 9a. The semiconductor topography is subjected to thermal radiation 45 while being exposed to an oxygen-bearing ambient. An oxide layer 46 is thusly formed upon LDD areas 42 and the surfaces of gate conductor 46. Oxide layer 46 is also thicker over the slanted sidewalls of the trench than elsewhere. FIG. 10b depicts a processing step subsequent to the step shown in FIG. 9b. After selectively etching nitride layer 16 from pad oxide layer 14, a S/D implant of dopant species is forwarded to the topography at a relatively high dose and energy. If a PMOS integrated circuit is being fabricated, p-type species are implanted, and if an NMOS integrated circuit is being formed, n-type species are implanted. Some commonly used n-type dopants are arsenic or phosphorus, and some commonly used p-type dopants are boron or boron difluoride. The thickness of gate conductor 40 serves as a mask during the S/D implant, and thus inhibits the dopant species from passing into the channel region of substrate 10. The presence of oxide layer 44 upon the trench sidewalls causes less dopant species to be implanted into the trench sidewalls than into the horizontal surface of substrate 10. As such, the single S/D implant forms both LDD areas 48 proximate the trench sidewalls and source and drain regions 50 beneath pad oxide 14 which helps disperse the dopants. The LDD areas are shallower than and have a lower concentration of dopants than source and drain regions 50. A post-implant anneal may be subsequently performed to active and position the as-implanted impurities.

Figure 11:
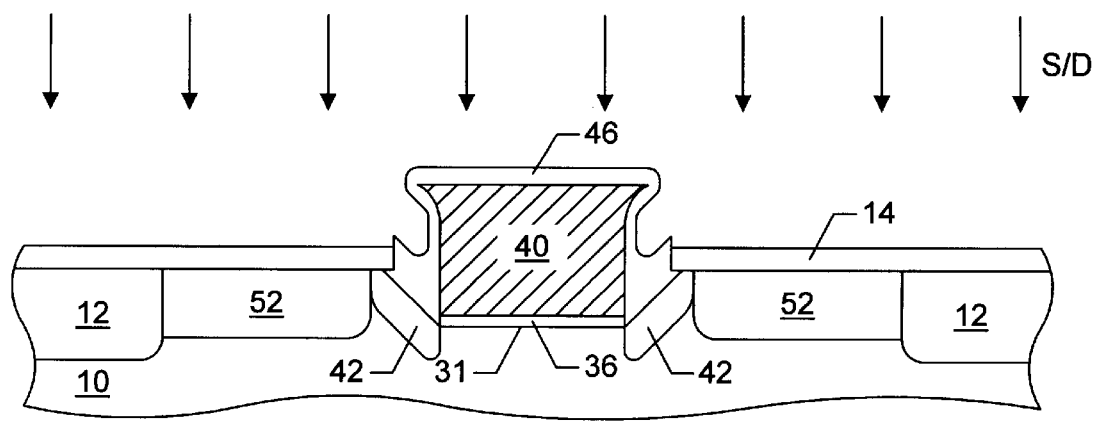

FIG. 11 illustrates a S/D implant being performed in addition to a previous LDD implant, and subsequent to the step depicted in FIG. 10a. Nitride layer 16 is removed prior to the S/D implant using an etch technique which is highly selective to nitride relative to oxide. Oxide layer 46 protects gate conductor 40 from being removed during this etch step. The S/D implant is performed at a higher dose and energy than the LDD implant. As a result of the S/D implant, source and drain regions 52 are placed beneath pad oxide 14. The presence of oxide layer 46 upon the trench sidewalls serves to prevent a substantial portion of the dopants passing therethrough from entering substrate 10. As such, the amount of dopant species passing into pre-existing LDD areas 42 is not significant enough to cause LDD areas 42 to have a dopant concentration similar to that of source and drain regions 52. A post-implant anneal may be performed to activate and position the as-implanted impurities.

Figure 12:
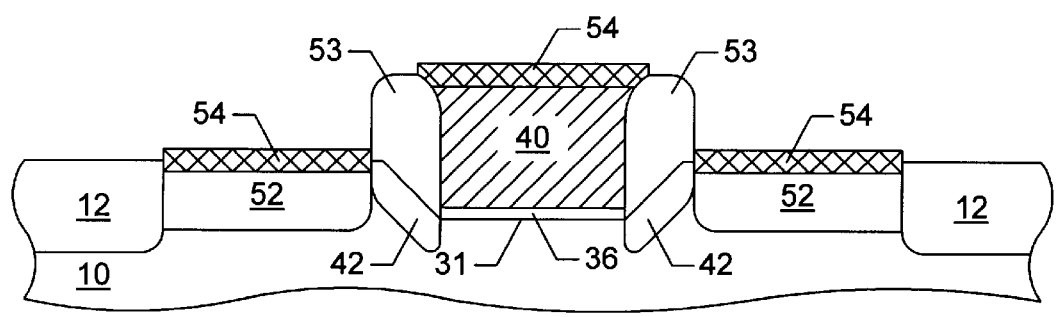
FIG. 12 is a partial cross-sectional view of the semiconductor topography, wherein silicide has been formed upon the source and drain regions and the upper surface of the gate conductor, subsequent to the step in FIG. 10b or in FIG. 11.

FIG. 12 illustrates the semiconductor topography depicted in FIG. 11 after self-aligned silicide (i.e., "salicide") structures 54 have been formed upon source and drain regions 52 and the upper surface of gate conductor 40 by reacting a refractory metal, e.g., titanium or cobalt, with the silicon surfaces of substrate 10. Prior to forming salicide structures 54, pad oxide layer 14 and oxide layer 46 may be removed from substrate 10 and gate conductor 40 using an etch technique highly selective to oxide. Dielectric sidewall spacers 53 may then be formed such that they extend laterally from the opposed sidewall surfaces of gate conductor 40. The sidewall spacers help prevent silicide from forming laterally adjacent gate conductor 40. Otherwise, the silicide could form a conductive path between gate conductor 40 and source and drain regions 52. Although not shown, an interlevel dielectric may subsequently be placed across the topography, and conductive contacts may be formed through the interlevel dielectric to salicide structures 54. Also, metal interconnect may be formed across the interlevel dielectric to couple together different contacts. The semiconductor topography depicted in FIG. 10b may be subjected to these processing steps as well.

It will be appreciated to those skilled in the art having the benefit of this disclosure that this invention is believed to provide a method for forming a transistor in which the gate conductor is arranged partially within a trench having opposed sidewalls which approach each other as they pass from the upper surface of a semiconductor substrate to the floor of the trench. Further modifications and alternative embodiments of various aspects of the invention will be apparent to those skilled in the art in view of this description. For example, a second trench may be etched within the substrate between the sidewall surfaces of the first trench, and a trench isolation structure may be formed within the second trench to isolate ensuing source/drain regions formed within the substrate between the sidewall surfaces of the first trench and the sidewall surfaces of the second trench. It is intended that the following claims be interpreted to embrace all such modifications and changes and, accordingly, the specification and drawings are to be regarded in an illustrative rather than a restrictive sense.

What is claimed is:

1. An integrated circuit comprising:

a semiconductor substrate comprising a trench, wherein the trench comprises a planar floor and opposed sidewalls which extend at an acute angle from the floor of the trench;

a gate conductor arranged above the floor of the trench and having a width less than a width of the trench;

lightly doped drain areas arranged within the substrate proximate the opposed sidewalls of the trench, wherein the lightly doped drain areas comprise a first concentration of dopant;

source and drain regions arranged within the substrate outside said trench, wherein the source and drain regions comprise a second concentration of dopant greater than the first concentration of dopant; and a layer of silicon dioxide residing upon the opposed sidewalls of the trench and laterally adjacent opposed sidewall surfaces of the gate conductor.

2. The integrated circuit of claim 1, wherein the silicon dioxide arranged upon the opposed sidewalls of the trench is substantially thicker than the silicon dioxide arranged laterally adjacent the opposed sidewall surfaces of the gate conductor.

3. The integrated circuit of claim 2, further comprising dielectric spacers arranged laterally adjacent the layer of silicon dioxide and silicide structures arranged upon the source and drain regions and an upper surface of the gate conductor.

4. A transistor comprising:

a trench formed within a semiconductor substrate, wherein the trench comprises a planar floor and opposed sidewalls that extend at an acute angle from the floor;

a gate dielectric located upon the planar floor of the trench;

a gate conductor located upon the gate dielectric and having a width less than a width of the trench;

lightly doped drain regions located within the semiconductor substrate proximal to the opposed sidewalls of the trench;

source and drain regions located within the semiconductor substrate laterally adjacent to the lightly doped drain regions; and dielectric spacer structures located laterally adjacent to opposed sidewall surfaces of the gate conductor.

5. The transistor of claim 4, wherein the acute angle comprises an angle in the range from approximately 25° to 55°.

6. The transistor of claim 4, wherein a lateral extent of the lightly doped drains is substantially equal to a lateral extent of the opposed sidewalls of the trench.

7. The transistor of claim 4, further comprising a channel region located within the semiconductor substrate and below the gate dielectric, wherein the channel region is lower than a lower surface of the source and drain regions.

8. The transistor of claim 4, wherein a first concentration of dopants within the lightly doped drain regions is less than a second concentration of dopants within the source and drain regions.

9. The transistor of claim 4, wherein a lateral extent of the dielectric spacer structures is substantially equal to a lateral extent of the opposed sidewalls of the trench.

10. The transistor of claim 4, further comprising salicide structures located upon the source and drain regions and an upper surface of the gate conductor.

11. The transistor of claim 10, wherein the salicide structures comprise titanium silicide.

12. The transistor of claim 4, wherein an upper portion of the gate conductor elevationally above an upper surface of the semiconductor substrate outside the trench has a width less than the width of the trench.

13. An integrated circuit comprising:

a semiconductor substrate comprising a trench, wherein the trench comprises a planar floor and opposed sidewalls which extend at an acute angle from the floor of the trench; and a gate conductor arranged above the floor of the trench and having a width less than a width of the trench, wherein an upper portion of the gate conductor elevationally above an upper surface of the semiconductor substrate outside the trench has a width less than the width of the trench.

14. An integrated circuit comprising:

a semiconductor substrate comprising a trench, wherein the trench comprises a planar floor and opposed sidewalls which extend at an acute angle from the floor of the trench, wherein the acute angle comprises an angle in the range from approximately 25° to 55°; and a gate conductor arranged above the floor of the trench and having a width less than a width of the trench.

\* \* \* \* \*